(12) United States Patent
Fredrickson et al.

(10) Patent No.: US 6,292,003 B1
(45) Date of Patent: Sep. 18, 2001

(54) APPARATUS AND METHOD FOR TESTING CHIP SCALE PACKAGE INTEGRATED CIRCUITS

(75) Inventors: Toby Alan Fredrickson; Eric D. Hornchek, both of San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/108,575

(22) Filed: Jul. 1, 1998

(51) Int. Cl.[7] ............... G01R 31/02; G01R 31/26
(52) U.S. Cl. ............ 324/754; 324/755; 324/758; 324/761; 324/765
(58) Field of Search .................. 324/754, 755, 324/758, 762, 765, 761; 439/66, 70, 71; 901/10; 438/15

(56) References Cited

U.S. PATENT DOCUMENTS

| | | | |
|---|---|---|---|
| 4,816,754 | * | 3/1989 | Bouchele et al. ............ 324/761 |
| 5,247,250 | * | 9/1993 | Rios ............................ 324/754 |
| 5,500,605 | * | 3/1996 | Chang ......................... 324/754 |
| 5,534,784 | * | 7/1996 | Lum et al. ................... 324/757 |
| 5,705,932 | | 1/1998 | Fredrickson ................. 324/754 |
| 5,952,840 | * | 9/1999 | Farnworth .................... 324/755 |
| 5,955,888 | * | 9/1999 | Frederickson et al. ...... 324/761 |
| 5,998,228 | * | 12/1999 | Eldridge et al. .............. 438/15 |
| 6,018,249 | * | 1/2000 | Akram et al. ................ 324/758 |

* cited by examiner

Primary Examiner—Safet Metjahic
Assistant Examiner—Anjan K Deb
(74) Attorney, Agent, or Firm—Patrick T. Bever; Edel M. Young

(57) ABSTRACT

An apparatus and method for testing "chip scale" integrated circuits (IC's) using a vertical probe card mounted on a printed circuit board (PCB). A nesting assembly mounted over the vertical probe card includes alignment walls and an alignment plate including chamfered through holes. The alignment walls are slanted to provide rough alignment of the IC within the nesting assembly, and fine alignment of the IC is achieved when the solder balls extending from the IC are received in the chamfers formed in the upper surface of the alignment plate. Tips of formed wire probes extend from the vertical probe card towards the bottom surface of the alignment plate. When the alignment plate is pushed towards the vertical probe card by a device handler, the tips of the wire probes extend through the through-holes and pierce the solder balls of the IC, providing electrical contact between the IC and the PCB.

9 Claims, 14 Drawing Sheets

APPARATUS AND METHOD FOR TESTING CHIP SCALE PACKAGE INTEGRATED CIRCUITS

FIELD OF THE INVENTION

The present invention relates to the methodology for testing micro ball grid array ($\mu$BGA) and chip scale package (CSP) integrated circuits (IC's), and more particularly, to an apparatus and method for providing electrical connections between a $\mu$BGA or CSP IC and an IC device tester.

BACKGROUND OF THE INVENTION

An integrated circuit (IC) typically includes an IC chip, which is housed in a plastic, ceramic, or metal "package". The IC chip includes an integrated circuit formed on a thin wafer of silicon. The package supports and protects the IC chip and provides electrical connections between the integrated circuit and an external circuit or system.

There are several package types, including ball grid arrays (BGA's), pin grid arrays (PGA's), plastic leaded chip carriers (PLCC's), and plastic quad flat packs. Each of the package types is typically available in numerous sizes. The package type selected by an IC manufacturer for a particular IC chip is typically determined by the size/complexity of the IC chip (i.e. the number of input/output terminals), and also in accordance with a customer's requirements.

FIGS. 1a and 1b show bottom and side sectional views of a typical BGA IC 100, which includes an IC chip 110 mounted on an upper surface 122 of a package substrate 120. Electrical connections between bonding pads of IC chip 110 and conductive lines (not shown) formed on substrate 120 are provided by bond wires 150. A plurality (twenty-five shown) of solder balls (sometimes referred to as solder bumps or solder dots) 140 are electrically connected to the conductive lines and extend from a lower surface 124 of substrate 120. Electrical signals travel between each solder ball 140 and one bonding pad of IC chip 110 along an associated conductive line and bond wire 150. A cover 130, such as a cap or "glob top", is placed or formed over IC chip 110 and bond wires 150 for protection.

IC manufacturers use an IC testing system to test their IC's before shipping them to customers. An IC testing system typically includes a device tester, a device handler, and an interface structure. The device tester is an expensive piece of computing equipment, which transmits test signals via tester probes to an interface structure. The interface structure transmits signals between the leads of an IC under test and the device tester. The device handler is an expensive precise robot for automatically moving IC's from a storage area to the interface structure and back to the storage area.

FIGS. 2a and 2b show side and top views of a conventional interface structure 200, which is used to test BGA IC's. Interface structure 200 includes a disk-shaped printed circuit board (PCB) 210 and a contactor 300. PCB 210 includes groups of outer vias 220, which are spaced around the perimeter of PCB 210. Outer vias 220 receive male tester probes extending from the device tester (not shown). Outer vias 220 are connected by metal traces (conductive lines) 230 to inner sockets 240 located in a central test area. Contactor 300 is mounted over the central test area such that pin terminals (discussed in further detail below) which extend from a lower surface of the contactor 300 are received in the sockets 240. After a BGA IC is mounted on contactor 300 by the device handler, the device tester transmits test signals through the male tester probes (not shown) to the outer vias 220, along traces 230 to the sockets, and finally through contactor 300 to the BGA IC under test. Similarly, return signals from the BGA IC are transmitted to the test device through contactor 300, socket 240, traces 230, and outer vias 220.

FIGS. 3a and 3b show top and side sectional views of a contactor 300. Contactor 300 includes a housing 310 and a nesting member 320 movably mounted on housing 310 via support springs 330. Housing 310 includes lower wall 312, side walls 314 extending upward around the periphery of lower wall 312, and spring mounts 316 for receiving one end of support springs 330. A peripheral edge of nesting member 320 is surrounded by outer side walls 314 of housing 310, thereby limiting horizontal movement of nesting member 320. However, a small gap G1 is provided between nesting member 320 and side walls 314 to allow vertical movement. Nesting member 320 includes a plate portion 322 positioned over the lower wall 312 of housing 310, and raised alignment walls 323 located at two corners of plate portion 322 which define a receiving area for BGA IC 100 (indicated in dashed lines). Plate portion 322 includes an indented area 324 having an upper surface 325, a lower surface 326, and a plurality of through-holes 328. Contactor 300 also includes a plurality of C-spring contacts 340 each having a C-shaped spring portion 342. Each spring contact 340 includes a contact portion 344 which extends through one of the through-holes 328 of nesting member 320, and a pin terminal 346 which extends through lower wall 312 of housing 310. When contactor 300 is mounted onto PCB 210, pin terminals 346 are received in sockets 240 formed in PCB 210.

While C-spring contacts 340 have been shown in FIG. 3b, several alternative methodologies exist for providing electrical contact with BGA IC 100 (indicated by dashed lines). A few of the more common methodologies include an S-spring contact 347, as shown in FIG. 3c, a fuzz button contact 348, as shown in FIG. 3d, and a pogo pin contact, as shown in FIG. 3e. However, all conventional methodologies share similar performance characteristics and issues.

Operation of conventional interface structure 200 is described with reference to FIGS. 4a and 4b. As shown in FIG. 4a, a device handler (not shown) places BGA IC 100 (shown in silhouette) onto nesting member 320 with solder balls 140 extending into indented area 324. BGA IC 100 is aligned on nesting member 320 by contact between the peripheral edge of BGA IC 100 and raised alignment walls 323 of nesting member 320. This alignment is intended to position solder balls 140 over the contact portions 344 of spring contacts 340. Subsequently, as shown in FIG. 4b, the device handler presses BGA IC 100 downward (in the direction indicated by arrow Z) against the force exerted by support springs 330. As nesting member 320 is displaced downward, solder balls 140 move toward and abut contact portions 344. Further downward force is absorbed by the spring portion of spring contacts 340. When BGA IC 100 is properly aligned, electrical signals are then transmitted between PCB 210 and BGA IC 100 through contact between solder balls 140 and contact portions 344 of spring contacts 340. The device handler then removes BGA IC 100, and nesting member 320 is biased into its original position by support springs 330.

Several problems are associated with conventional interface structure 200, and in particular, to conventional contactor 300.

First, contactor 300 is expensive (approximately $500 or more) and also very fragile. Pin terminals 346 of spring contacts 340 are often bent or damaged when contactor 300 is mounted to PCB 210. Straightening or replacing bent pin terminals 346 is extremely time-consuming, and therefore IC testing system operators often simply discard damaged contactors. Further, due to their simple construction, spring contacts 340 typically weaken and fail after a relatively low number of test procedures. As a result, device testing using conventional interface structures is expensive and often time-consuming.

A second problem associated with conventional interface structure 200 is described with reference to FIG. 4c. Nesting member 320 can become misaligned due to temperature variations. Interface structures are typically mounted on device testers at room temperature. Subsequent testing procedures are often performed at much higher temperatures. This temperature difference causes deformation of spring contacts 340, which shift nesting member 320 horizontally relative to housing 310 (indicated in FIG. 4c by a gap G2, which is larger than gap G1 shown in FIG. 3b). Because the device handler is adjusted to mount BGA IC 100 in the original (room temperature) position of nesting member 320, this shift results in a relative misalignment between BGA IC 100 and nesting member 320. Alternatively, due to repeated lateral motion when BGA IC's 100 are inserted and removed from nesting member 320, nesting member 320 may become permanently biased to one side. Also, manufacturing inaccuracies can cause nesting member 320 to be misaligned from the beginning. In some cases, as shown in FIG. 4c, BGA IC 100 is mounted such that one corner is located on top of alignment wall 323. When this occurs, subsequent downward pressure by the device handler often destroys BGA IC 100. Unless this problem is quickly recognized and corrected, significant product loss can occur. One possible solution to this problem is to widen alignment wall 323 and provide a long, tapered surface such that BGA IC's slide easily into position on nesting member 320. However, because the overall width of contactor 300 is typically restricted, and because a portion of this width is occupied by side walls 314 of housing 310, the width of nesting member 320 (and, therefore, alignment wall 323) is limited.

A third problem associated with conventional interface structure 200 is described with reference to FIG. 4d. In particular, alignment within nesting member 320 is based on the outer peripheral shape of BGA IC 100. If the position of solder balls 140 relative to the outer edge of substrate 120 (shown in FIG. 1a) is shifted during package manufacturing, the resulting misalignment can result in total misalignment between contact portions 344 and solder balls 140, as shown in FIG. 4d.

Further, partial misalignment between solder balls 140 and contact portions 344 can cause BGA IC 100 to become wedged (stuck) to contact members 342 as shown in FIG. 5a. As BGA IC 100 is pressed downward, the partial misalignment causes contact portions 344 to slide along the outer sloped edge of solder balls 140, thereby causing deflection of contact portions 344 against plate portion 322 surrounding through-holes 328. This wedging action can resist subsequent upward movement of BGA IC 100, thereby causing BGA IC 100 to become disengaged from the device handler, and causing a costly shut-down of the testing process.

A final problem associated with conventional interface structure 200 is described with reference to FIGS. 5b and 5c. In particular, because of the various alignment problems associated with conventional interface structure 200 (discussed above), it is required to utilize a relatively wide contact portion 344(1) shown in FIG. 5b, or a cup-shaped contact portion 344(2) shown in FIG. 5c to ensure contact with solder balls 140. However, the flat upper surface 345 of contact portion 344(1) serves as a ledge upon which tin-lead contamination 346 from solder balls 140 deposits over a period of time. Similarly, the cup-shaped contact portion 344(2) collects tin-lead contamination 346. Tin-lead contamination 346 imposes a resistance between contact portions 344(1) and 344(2) and solder ball 140, thereby causing incorrect test results and the erroneous discarding of good parts.

Currently, the trend in industry is towards smaller IC chips having a greater number of bonding pads. At the same time, IC size requirements are also shrinking. As a result, miniature IC's are becoming increasingly more difficult to produce using traditional IC packaging methods. Not only do the traditional methods have difficulty accommodating the dense bonding pad arrangements of the smaller IC chips, but the "traditional" package substrate is significantly larger than the IC chip, further inhibiting the trend towards miniaturization. These decreasing IC chip packaging size requirements have led to the development of "chip scale" packaging methodologies such as micro ball grid array ($\mu$BGA) packaging and chip scale packaging (CSP). These packaging methodologies are characterized by the fact that the IC chip package is essentially the same size as the IC chip, or that electrical connections such as solder balls or solder columns are attached directly to the bonding pads of the IC chip. Whereas a conventional BGA IC might provide 1.27 mm from solder ball center to solder ball center, a "chip scale" package can have less than 0.5 mm between adjacent solder balls.

FIGS. 12a and 12b show an IC 1200 that is consistent with "chip scale" packaging methodologies. IC 1200 includes an IC chip 1210 that has a plurality of bonding pads (not shown) formed thereon, and a plurality of solder balls 1220 that are directly attached to the bonding pads. This direct connection causes the density of electrical connections provided by IC 1200 to be the same as that of the bonding pads on IC chip 1210. As a result, the traditional methods of testing BGA IC's (discussed above) cannot be used to test "chip scale" IC's because it is not physically possible to pack the C-spring contacts (shown in FIG. 3b), the S-spring contacts (shown in FIG. 3c), the fuzz button contacts (shown in FIG. 3d), or the pogo pins (shown in FIG. 3e) closely enough to reliably contact the high-density solder balls.

IC manufacturing, regardless of chip size, involves producing multiple dies on a single wafer and then singulating them into individual IC chips. IC chips are typically tested while still in wafer form, using a technique known as "wafer probing". Historically, wafer probing has been performed using a wafer testing system 600, as shown in FIG. 6. A processed wafer 610 made up of a plurality of dies 612 is mounted on a wafer support structure 620. A precision placement robot 630 positions a lateral probe assembly 640 over one of the plurality of dies 612 and then lowers probe assembly 640 until electrical contact is made with the bonding pads on die 612. Probe assembly 640 then transmits test signals between die 612 and a test controller (not shown). Placement robot 630 then raises probe assembly 640 from die 612 and positions itself over another of the plurality of dies 612 to be tested.

Typically, referring to FIGS. 7a and 7b, a probe assembly 640 includes a lateral probe assembly 700. Lateral probe assembly 700 includes a PCB 710 and a grouping of probe leads 720 in a central opening 712 of PCB 710. Each probe lead 720 extends into central opening 712, angling downward and tapering to a small probe tip 722. Probe tips 722 are arranged in a pattern matching the layout of bonding pads on the dies to be tested. When lateral probe assembly 700 is lowered onto a die, probe tips 722 contact the bonding pads on the die to provide an electrical connection. Further downward force is absorbed by the flexibility of probe leads 720. Probe leads 720 are connected by metal traces (not shown) to outer vias 730. The test controller transmits and receives signals through male tester probes (not shown) mounted into outer vias 730.

As bonding pad densities increase, probe leads 720 must undergo a corresponding size reduction, increasing the risk of lead damage during handling and test. In addition, due to the planar construction of lateral probe assembly 700, only dies having peripherally-located bonding pads can be tested. Therefore, the grid patterns of bonding pads in high-density IC wafers are problematic for conventional wafer test systems.

A recent development in wafer testing enables the testing of high-density IC wafers. FIGS. 8a and 8b show a vertical probe assembly 800 that includes a vertical probe card 820 mounted on the bottom surface of a PCB 810. A group of probe tips 822 protrude substantially normally from a lower surface 824 of vertical probe card 820. Each probe tip 822 is part of a formed wire probe (not shown) mounted within vertical probe card 820. The formed wire probe includes a spring section (not shown) to bias its probe tip 822 away from lower surface 824. The use of fine-diameter wire for the formed wire probes enables a high-density array of probe tips 822 to be provided by vertical probe card 820. As a result, vertical probe assembly 800 can replace lateral probe assembly 700 in wafer testing system 600 in order to test wafer scale dies. When vertical probe assembly 800 is lowered onto a die, probe tips 822 contact the bonding pads on the die to provide an electrical connection. Further downward force is absorbed by the spring sections of the formed wire probes. Metal traces (not shown) on PCB 810 connect the formed wire probes to outer vias 830. The test controller (not shown) transmits and receives signals through male tester probes (not shown) mounted into outer vias 830.

However, although the vertical probe card allows the dies of a wafer to be tested, no apparatus or method currently exists for testing "chip scale" IC's (i.e., after wafer dicing). Accordingly, it is desirable to provide an apparatus and method for reliably testing µBGA and CSP IC's.

SUMMARY OF THE INVENTION

The present invention is directed towards apparatus and methods for testing "chip scale" IC's that overcome the limitations of conventional apparatus and methods. By utilizing a vertical probe card previously used only for wafer testing, the high density contacts found on "chip scale" IC's can be accommodated.

In accordance with an embodiment of the present invention, an apparatus for testing IC's includes a vertical probe card modified with a nesting assembly. The present invention provides an interface apparatus for an integrated circuit (IC) testing system. An embodiment of the present invention includes a vertical probe card mounted on a circuit board, and a nesting assembly mounted on the circuit board over and around the vertical probe card. The nesting assembly includes an alignment plate movably connected to the circuit board by a guide shaft and biased away from the surface of the circuit board by a spring. The alignment plate includes an array of through holes in the same pattern as an array of contact terminals (solder balls) of an IC to be tested. A plurality of guide rails surround the array of through holes in the alignment plate, defining a generally rectangular test area slightly larger than the outer dimensions of the IC to be tested. The vertical probe card is similar to the type used in die testing of processed wafers. The array of through holes in the alignment plate is maintained in alignment with an accurately positioned array of wire probe tips protruding from the upper surface of the vertical probe card by the guide shaft used to attach the alignment plate to the circuit board. The IC is guided into the test area by chamfers on the plurality of guide rails, whereupon chamfers on the array of through holes in the alignment plate engage the contact terminals of the IC to provide final alignment. When the IC is pressed downward, the contact terminals of the IC are contacted by the tips of the wire probes, thereby providing electrical connection between the interface apparatus and the IC. The circuit board used with the vertical probe card can be the same circuit board used in the testing of the dies prior to packaging, thereby enhancing reliability of the testing procedure due to consistency of hardware.

The vertical probe card includes a probe assembly mounted on a space transformer. The probe assembly includes a positioning plate rigidly affixed over a mounting plate, and a plurality of pre-bent wire probes fixedly installed in the mounting plate. The tips of the wire probes are accurately located by an array of clearance holes in the positioning plate, which matches the pattern of through holes in the alignment plate. Because the positioning plate only allows vertical motion of the wire probes, improper electrical contacts due to lateral deformations of the wire probes is prevented. The space transformer mounts onto the circuit board and routes electrical signals between the circuit board and the plurality of wire probes. Because the probe assembly and the space transformer are not permanently mounted (soldered) to the circuit board or each other, either one can be readily changed out for offline rework or repair without causing significant downtime in the testing process. When an IC is mounted on the alignment plate and pressed downward, the contact terminals (solder balls) of the IC are contacted by the tips of the wire probes, thereby providing electrical connection between the interface apparatus and the IC. The fine diameter wire probes provide a provide a constant force against the contact terminals of the IC, thereby enabling the tips of the wire probes to break through any oxidation or contamination surface layer and provide reliable electrical contact.

Another embodiment of the present invention includes a vertical probe card mounted on a circuit board without a nesting assembly. The tips of the wire probes are accurately located by an array of clearance holes in the positioning plate, which matches the pattern of contact terminals of an IC being tested. A plurality of guide rails surround the array of clearance holes in the positioning plate, defining a generally rectangular test area slightly larger than the outer dimensions of the IC. The IC is guided into the test area by chamfers on the plurality of guide rails, whereupon chamfers on the array of clearance holes in the positioning plate engage the contact terminals of the IC to provide final alignment. When the IC is pressed downward, the contact terminals of the IC are contacted by the tips of the wire probes, thereby providing electrical connection between the interface apparatus and the IC. Because the circuit board used with the vertical probe card is the same as the circuit board used in the testing of the dies prior to packaging, reliability of the testing procedure is enhanced due to consistency of hardware. A high-precision positiveplacement device handler can be used to position the IC in the test area, eliminating the need for the guide rails on the positioning plate due to the lack of gravity being used as an alignment source.

In accordance with another embodiment of the present invention, a method for testing an IC includes the step of positioning the IC over a plurality of wire probes extending from a vertical probe card, and then moving the alignment plate toward the vertical probe card, such that the pointed tips of the wire probes pierce the solder balls of the IC. By piercing the solder balls using fine-diameter wire probes, reliable electrical contact is provided between the wire probes and the solder balls, and contaminants on the tips of the wire probes are sloughed off when a subsequent solder ball is pierced, thereby achieving repeated good contact and preventing erroneous test results.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE DRAWINGS

Figure 9A:
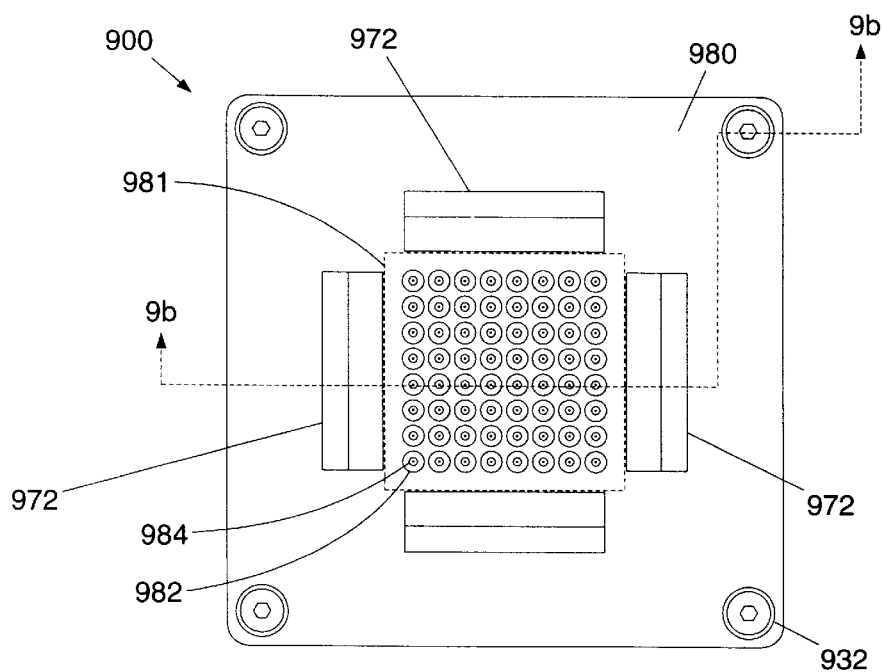
FIGS. 9a and 9b are respective top and sectional side views of an interface apparatus for testing IC's in accordance with the present invention.
Figure 9B:
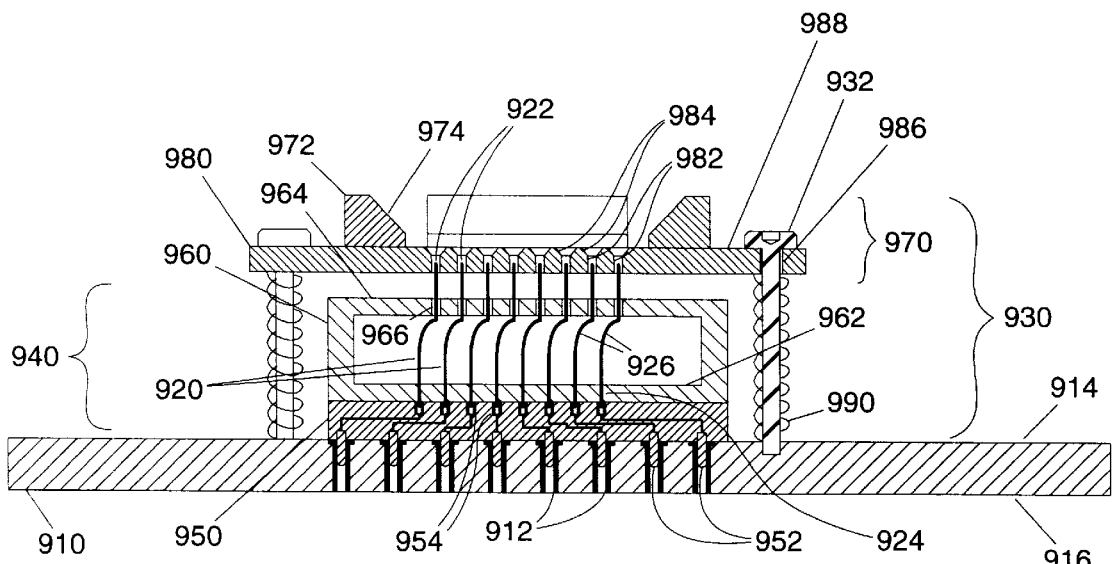

FIGS. 9a and 9b show an interface apparatus 900 in accordance with an embodiment of the present invention. Similar to the conventional apparatus 200 (discussed above), interface apparatus 900 is utilized with a device tester and a device handler to facilitate testing of ball grid array (BGA) integrated circuits (IC's), such as BGA IC 100 (discussed above), and micro-ball grid array (μBGA) and chip scale packaged (CSP) IC's. As used herein, the term "BGA IC" refers to any product having solder balls or bumps for connecting the integrated circuit to external circuitry.

Interface apparatus 900 generally includes a contactor assembly 930 including a vertical probe card 940 and a nesting assembly 970, both of which are mounted on a printed circuit board (PCB) 910.

Figure 1A:
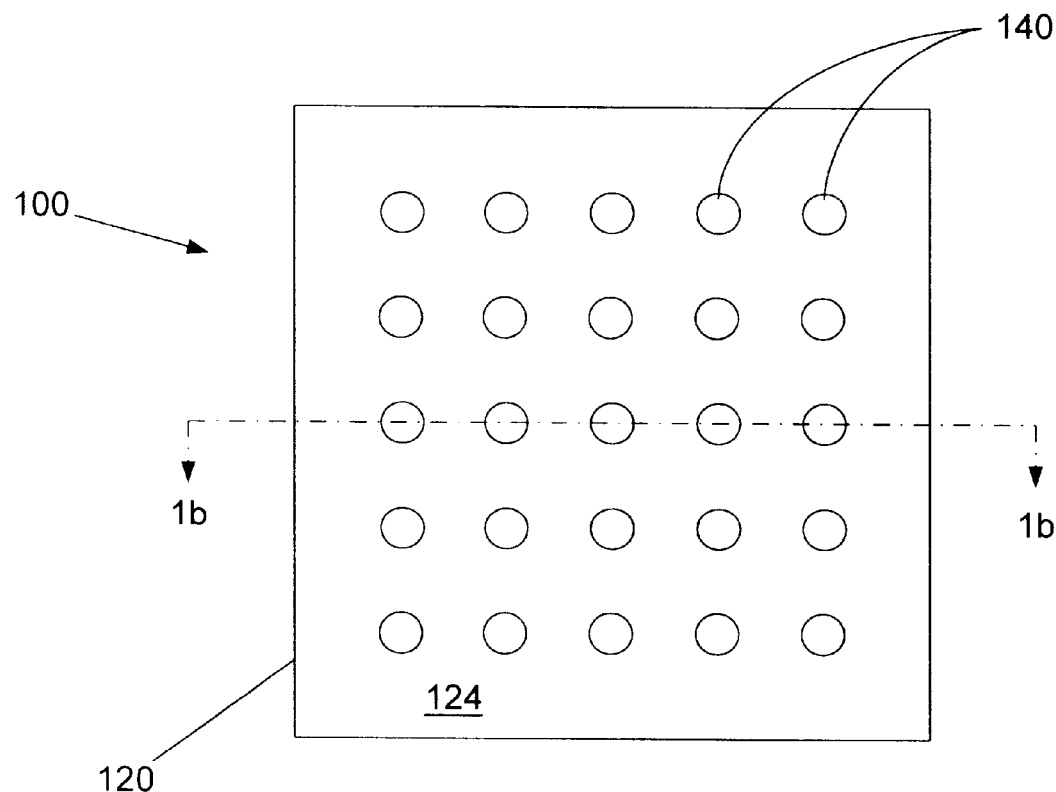
FIGS. 1a and 1b are respective bottom and sectional side views of a conventional BGA IC.
Figure 1B:
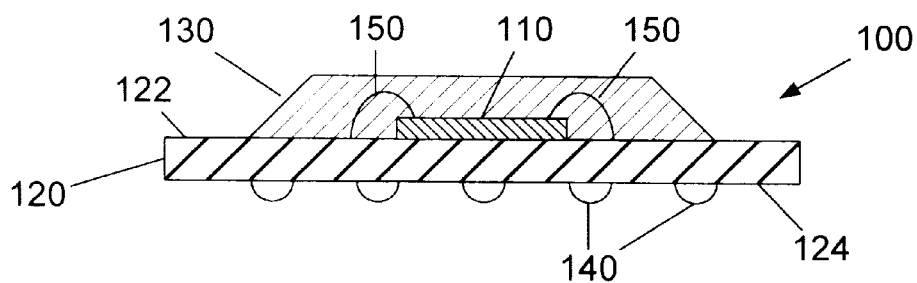
Figure 2A:
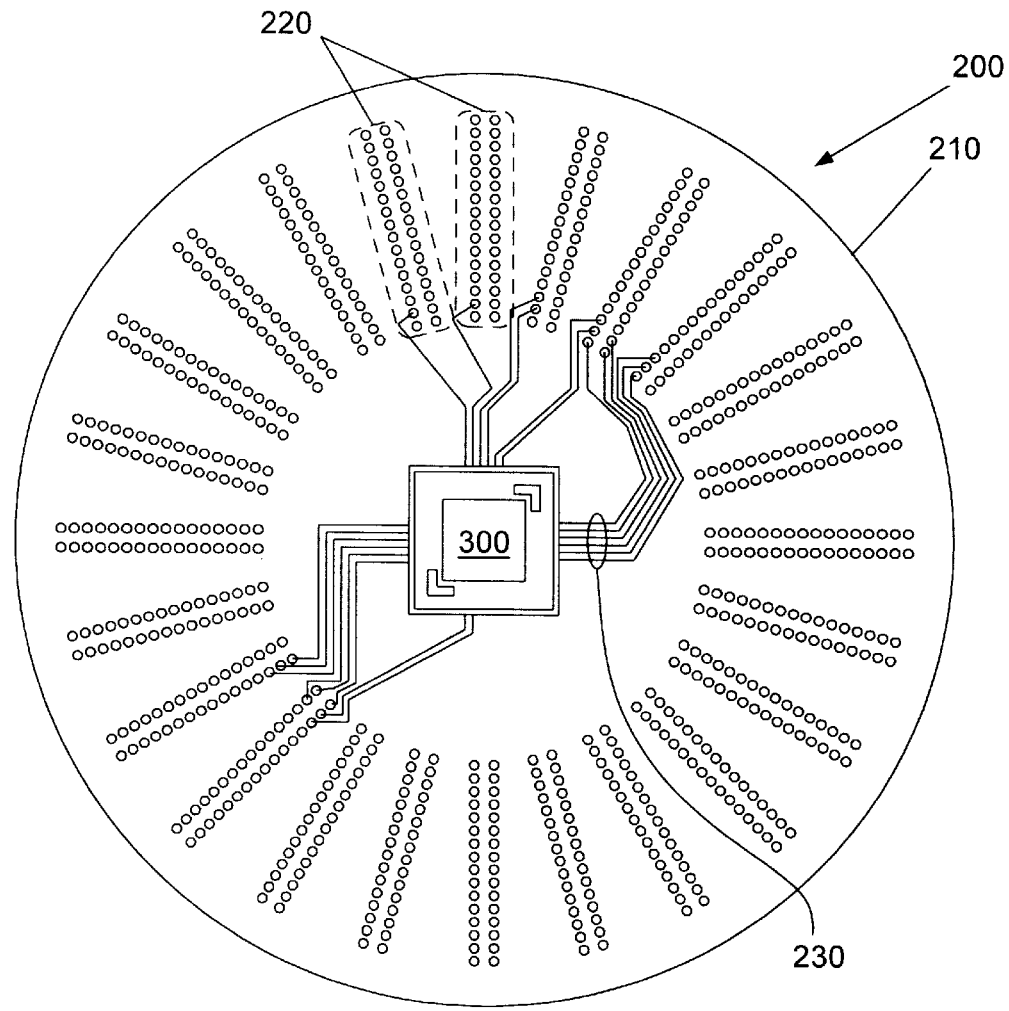
FIGS. 2a and 2b are respective top and side views of a conventional interface structure.
Figure 2B:
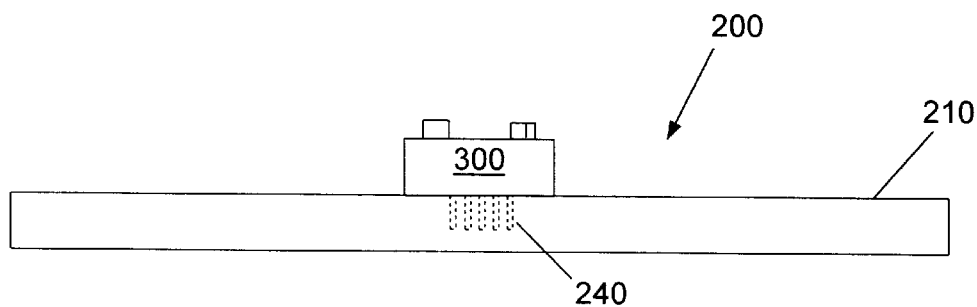
Figure 3A:
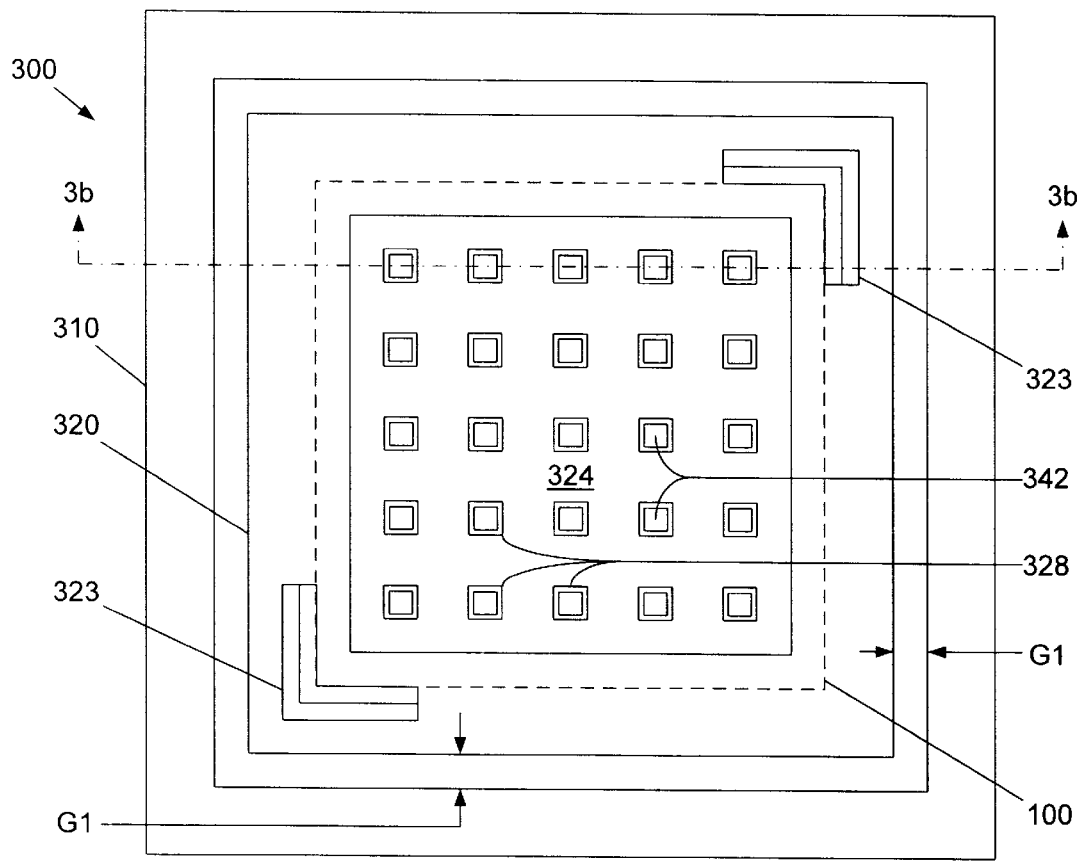
FIGS. 3a and 3b are respective top and sectional side views of a contactor of the conventional interface structure.
Figure 3B:
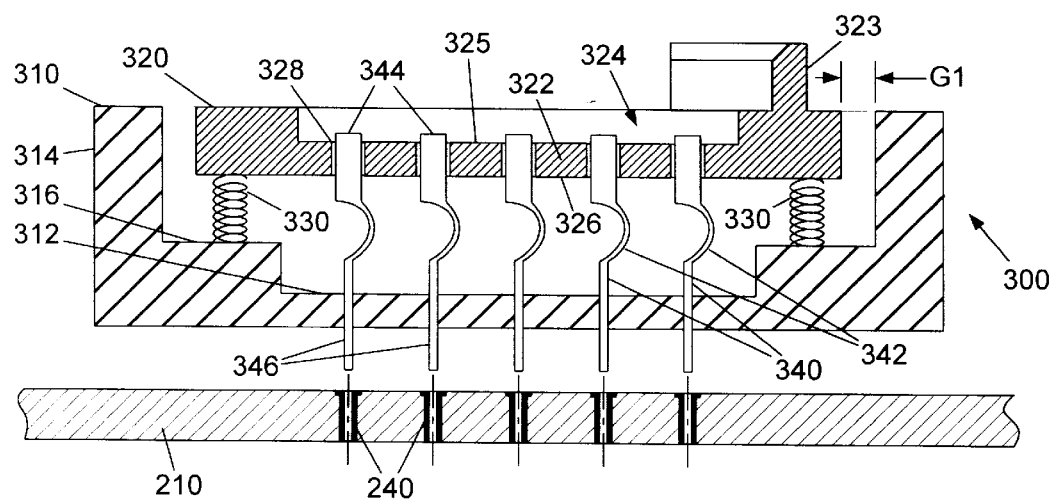
Figure 3C:
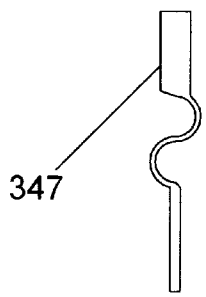
FIGS. 3c–3e are side views of common contact devices used in conventional interface structures.
Figure 3D:
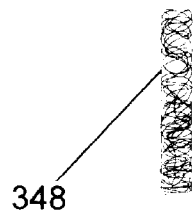
Figure 3E:
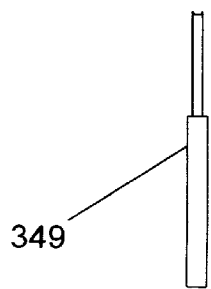
Figure 4A:
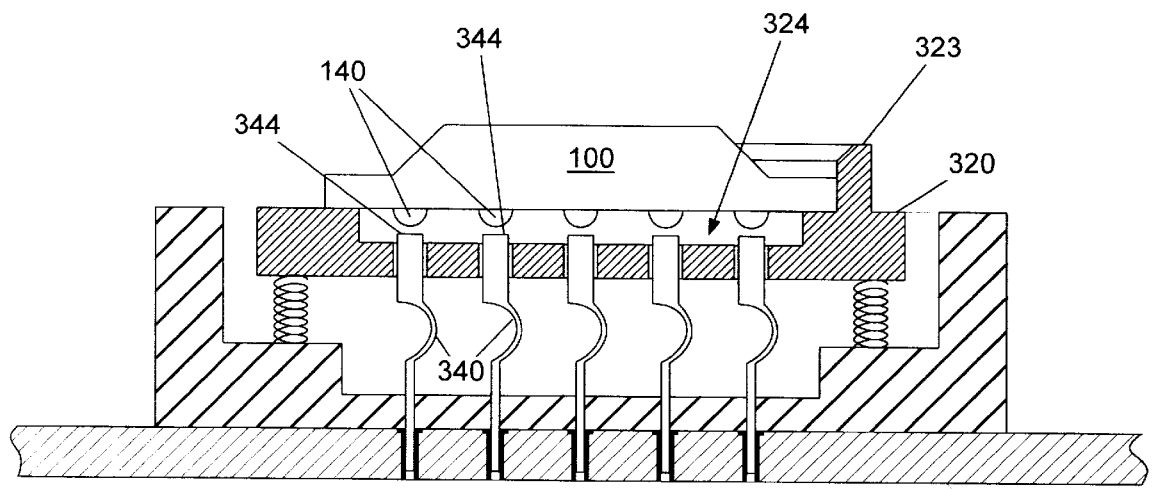
FIGS. 4a–4d are sectional side views of the conventional contactor illustrating various operating conditions.
Figure 4B:
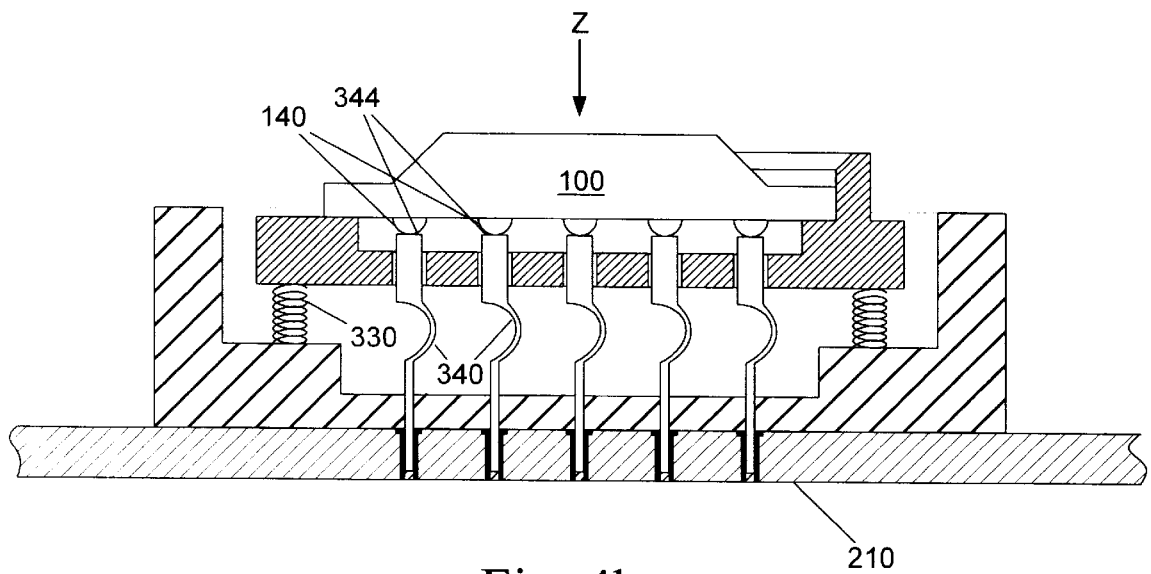
Figure 4C:
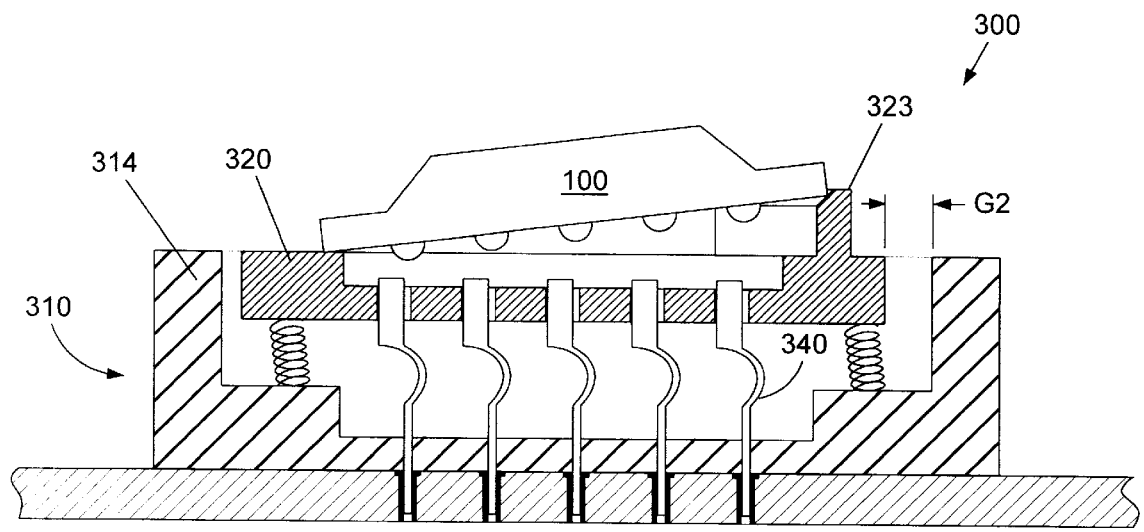
Figure 4D:
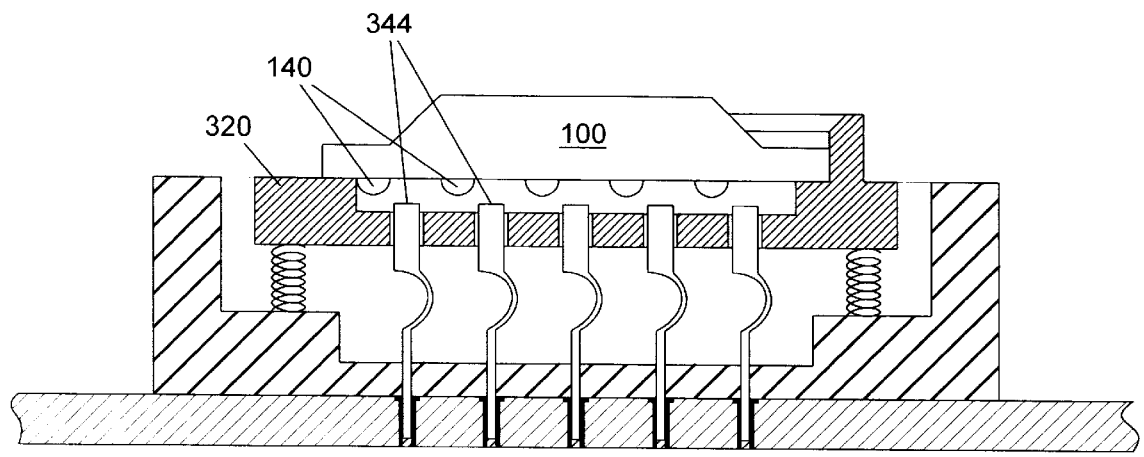
Figure 5A:
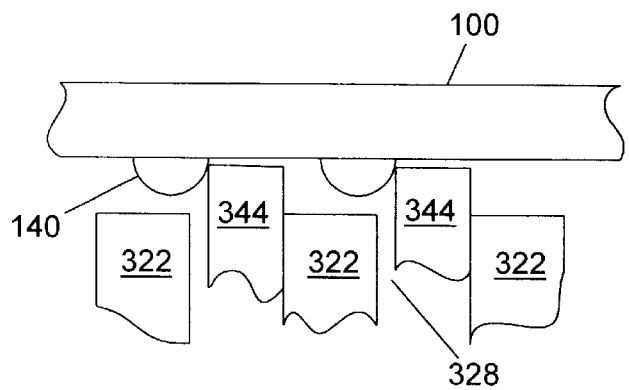
FIGS. 5a–5c are enlarged side views of portions of the conventional contactor and a BGA IC.
Figure 5B:
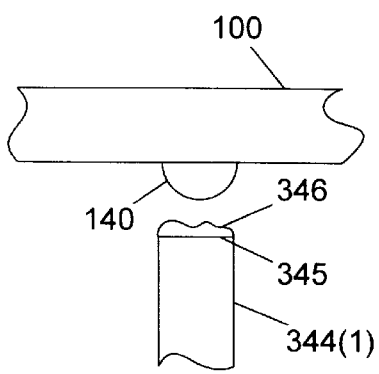
Figure 5C:
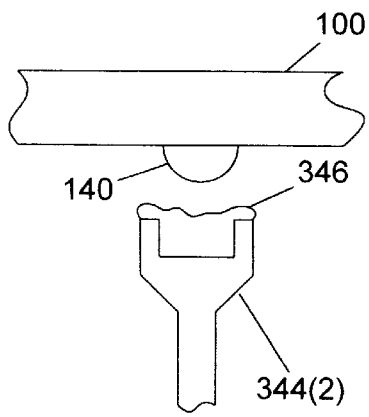
Figure 6:
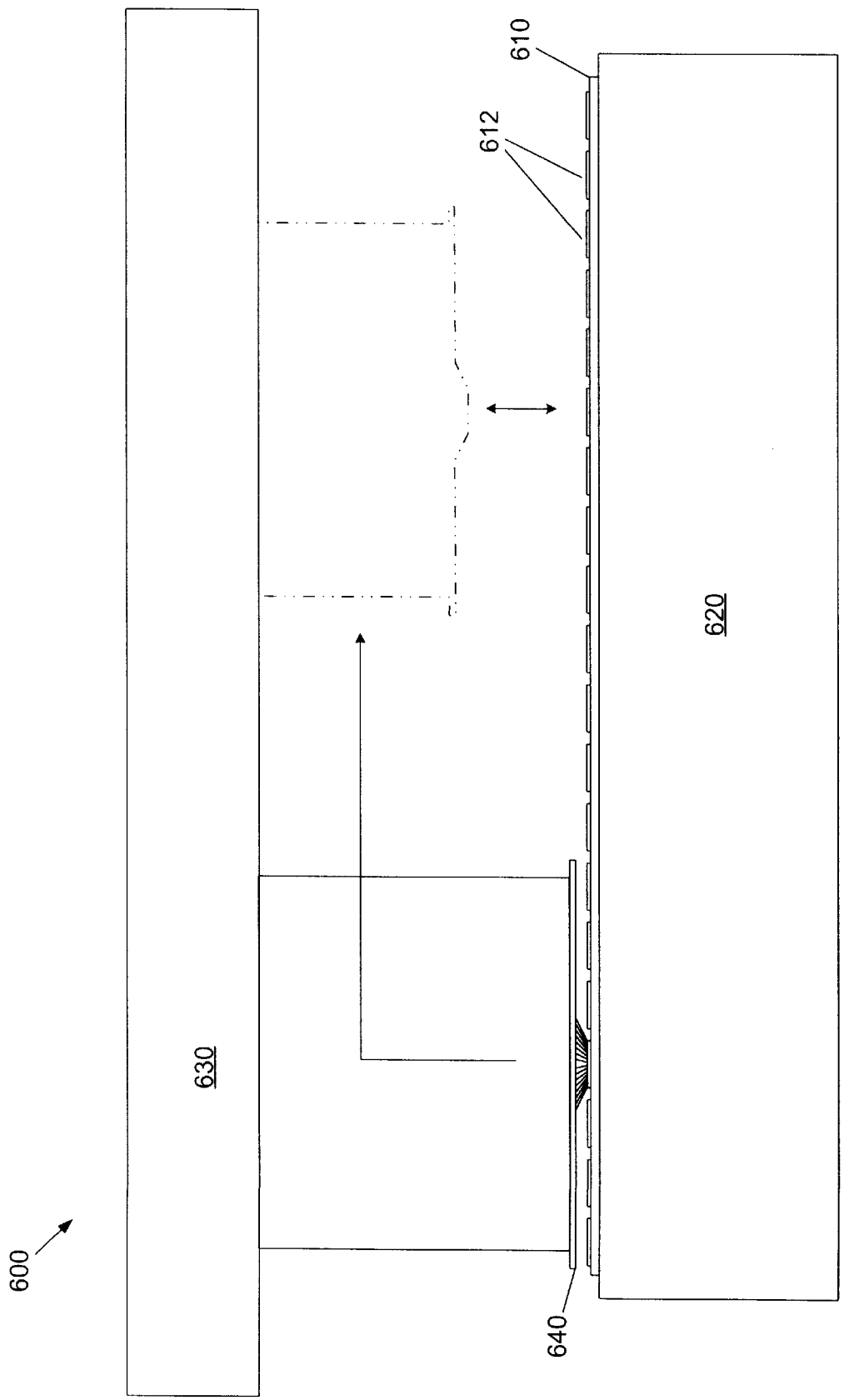
FIG. 6 depicts a conventional wafer testing system.
Figure 7A:
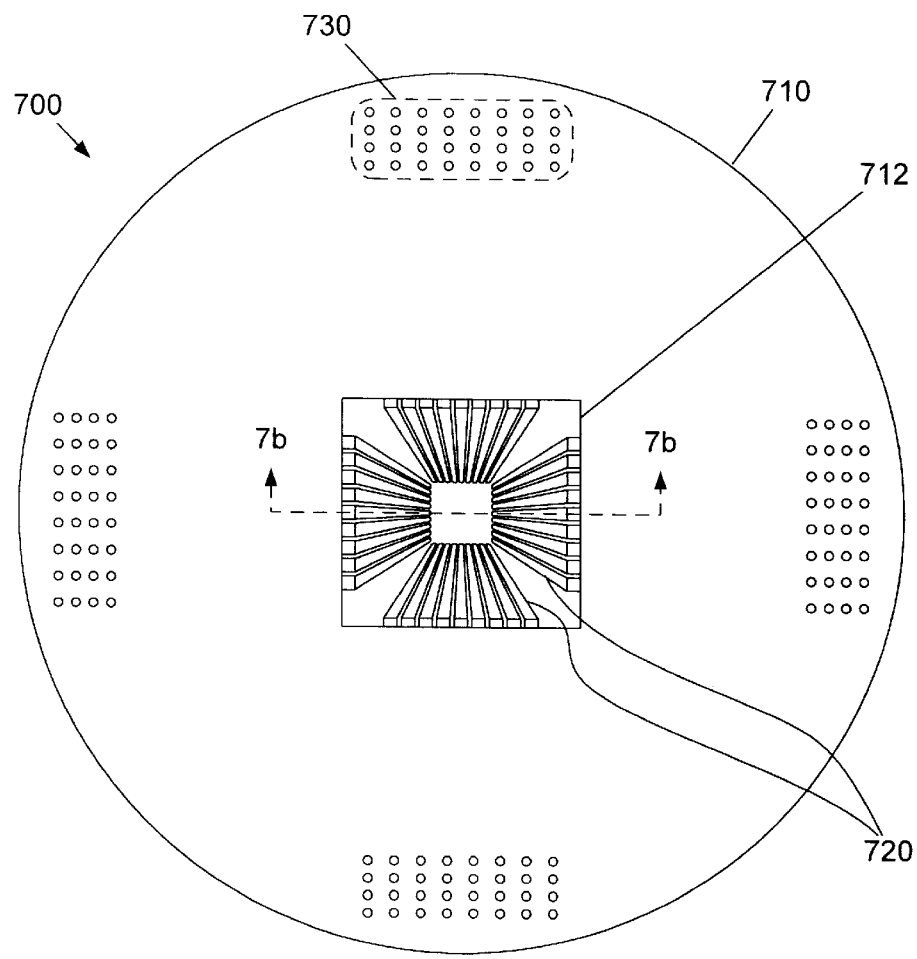
FIGS. 7a and 7b are respective top and sectional side views of a conventional lateral probe assembly used to test wafers.
Figure 7B:
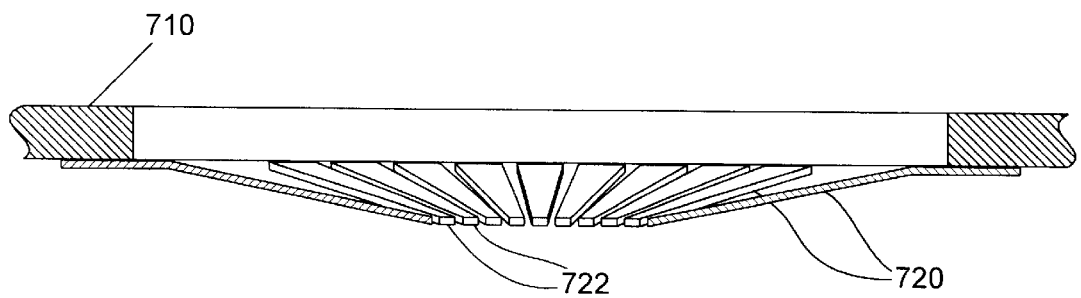
Figure 8A:
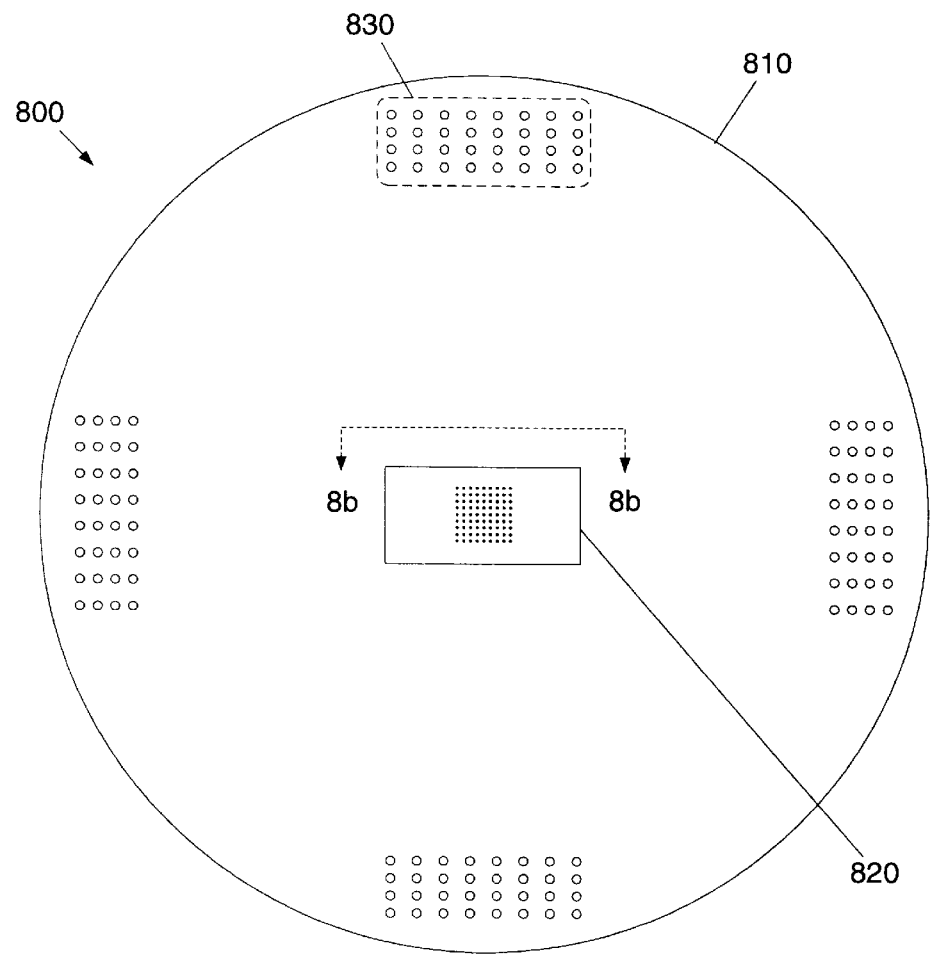
FIGS. 8a and 8b are respective bottom and sectional side views of a vertical probe assembly used to test wafers.
Figure 8B:
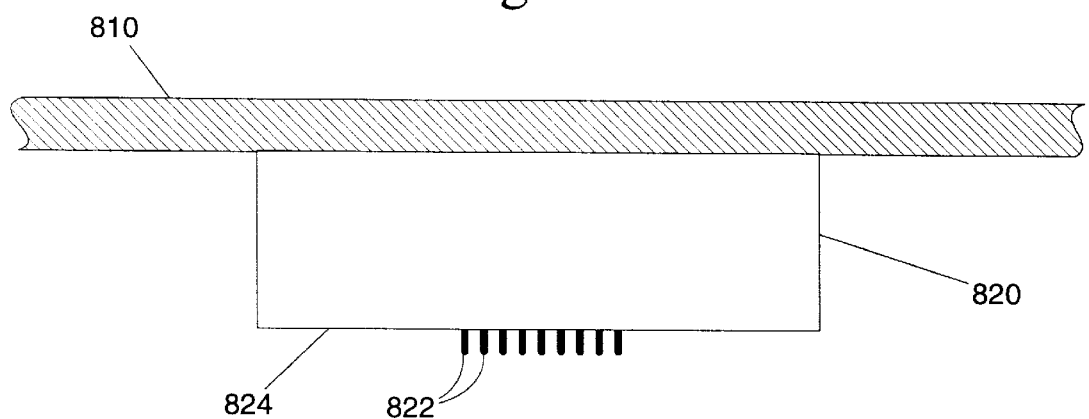

PCB 910 is similar in construction to the conventional PCB 210 (as shown in FIG. 2a) in that PCB 910 includes outer (first) vias (corresponding to outer vias 220) for connection to the male test probes of a device tester or to a mother board, sockets 912, and conductive lines (corresponding to conductive lines 230) for carrying signals from the outer vias to sockets 912. PCB 910 includes an upper surface 914 and an opposing lower surface 916. In one embodiment, PCB 910 has a thickness (measured between upper surface 914 and lower surface 916) on the order of ⅜" as defined by a customer or by requirements of the tester.

FIG. 9b illustrates the test area of PCB 910 associated with a single contactor assembly 930. In alternative embodiments, two or more test areas may be formed on PCB 910. Further, a mother board/daughter board arrangement, such as that described by Fredrickson in co-owned U.S. Pat. No. 5,705,932, issued Jan. 6, 1998 entitled "System for Expanding Space Provided By Test Computer to Test Multiple Integrated Circuits Simultaneously", which is incorporated herein by reference, may be utilized to provide two or more test areas.

In accordance with an aspect of the present invention, vertical probe card 940 is mounted on PCB 910. Vertical probe card 940 is similar to conventional vertical probe cards used for wafer testing, an example of which is the "Cobra Probe", manufactured by Upsys Reseau Eurisys, located in France. Vertical probe card 940 includes a probe assembly 960 and a space transformer 950. Probe assembly 960 includes a mounting plate 962 and a positioning plate 964. Positioning plate 964 is rigidly mounted above mounting plate 962 and includes a plurality of clearance holes 966 which are arranged in the same pattern as the solder balls of a BGA IC to be tested, such as IC 1200. A plurality of preformed wire probes 920 are fixedly mounted in mounting plate 962. Each wire probe 920 includes a wire probe tip 922 that extends through one of the clearance holes 966 of positioning plate 964. Clearance holes 966 accurately position wire probe tips 922 for BGA IC testing, while still allowing vertical motion of probe tips 922. Because of the fine diameter of wire probes 920, a very dense pattern of probe tips 922 can be provided. For example, the "Cobra Probe" vertical probe card mentioned previously can provide a tip-to-tip spacing in the range from 0.5 mm to 0.13 mm. Each wire probe 920 also includes a pin terminal 924 which extends through mounting plate 962. In the embodiment shown in FIG. 9b, probe assembly 960 is mounted onto space transformer 950, and pin terminals 924 are received in a plurality of sockets 954 formed in space transformer 950. In a possible alternative embodiment (not shown), probe assembly 960 is mounted directly onto PCB 910, and pin terminals 924 are received in sockets formed in PCB 910.

Space transformer 950 includes a plurality of pins 952, each of which is electrically connected to a unique one of sockets 954. When contactor assembly 930 is mounted onto PCB 910, pins 952 are received in a plurality of sockets 912 formed in PCB 910. Pins 952 of space transformer 950 provide a larger, more robust interface structure for contactor assembly 930 and minimize the possibility of damage to the more fragile pin terminals 924 of probe assembly 960. However, in the event that one of the wire probes 920 is damaged, probe assembly 960 can be detached from space transformer 950 for offline repair, while a replacement probe assembly can be installed to minimize testing downtime.

Each wire probe 920 includes a formed spring section 926 to bias probe tips 922 upward (away from PCB 910). The use of formed wire spring sections 926 allows wire probes 920 to provide much more durable spring resistance than spring contacts using C-shaped or S-shaped spring sections. Wire probes 920 are formed from conductive material, so signals are transmitted between probe tips 922 and their associated outer vias (similar to vias 220 of PCB 210) through sockets 954 and pins 952 of space transformer 950, through sockets 912 formed in PCB 210, and along conductive lines (not shown) which are formed on PCB 910.

Contactor assembly 930 also includes a nesting assembly 970, which provides a non-conductive alignment plate 980 mounted on PCB 910 over vertical probe card 940 and biased away from vertical probe card 940 by coil springs (resilient members) 990. Alignment plate 980 may be formed from a rigid laminate such as GETEX available from General Electric Corp., a high performance polyimide, a nonconductive epoxy such as FR4 (also referred to as G-10), Teflon™, or any other suitable non-conductive material.

In accordance with an aspect of the present invention, four shoulder bolts (guide shafts) 932 extend slidably through guide holes 986 in alignment plate 980 where they are screwed or otherwise fixedly attached to PCB 910. Alternatively, shoulder bolts 932 can be fixedly attached to mounting points on vertical probe card 940. Shoulder bolts 932 limit the upward motion of alignment plate 980. A coil spring 990 is provided around the shaft of each shoulder bolt 932 for biasing alignment plate 980 upward from PCB 910. Shoulder bolts 932 guide the vertical movement of alignment plate 980 during the device testing procedure described below. In particular, shoulder bolts 932 prevent horizontal displacement of alignment plate 980 relative to vertical probe card 940, thereby preventing misalignment between the solder balls of the BGA IC being tested and probe tips 922.

Alignment plate 980 is provided to align probe tips 922 of wire probes 920 with the solder balls (contact terminals) of a BGA IC under test. In particular, alignment plate 980 extends over positioning plate 964 of probe assembly 960 and defines a plurality of openings 982 arranged in a predetermined pattern such that one probe tip 922 of an associated wire probe 920 extends through an associated opening 982. In accordance with an aspect of the present invention, four alignment structures 972 are positioned around the array of openings 982 and define a central test area 981 for receiving an IC. Each alignment structure 972 includes an alignment chamfer 974 which slopes toward central test area 981 for positioning gravity-feeding BGA IC's onto central test area 981. Alignment structures 972 may be formed separately and mounted to alignment plate 980 using, for example, screws or adhesive. Alternatively, alignment structures 972 and alignment plate 980 may be machined as a single piece. Because shoulder bolts 932 restrict horizontal movement of alignment plate 980, a width of alignment plate 980 is not restricted, as in conventional contactor 300. As a result, alignment structures 972 may be significantly wider and have larger alignment chamfers 974 than those provided in conventional contactor 300, thereby facilitating reliable seating of an IC on alignment plate 980 during the device testing procedure.

In accordance with another aspect of the present invention, upper surface 988 of alignment plate 980 is provided with a plurality of chamfers 984, each chamfer 984 being formed around one through-hole 982. Chamfers 984 are used to provide fine alignment of BGA IC's during the device testing procedure for contact with probe tips 922. In particular, when a BGA IC is mounted on alignment plate 980, the solder balls of the IC are gravity-fed into (i.e., become engaged with) chamfers 984, thereby aligning the IC on the basis of its solder balls. By providing chamfers 984 which align BGA IC's based on the position of their solder balls, the present invention avoids the misalignment problem caused by variations in the solder ball position relative to the peripheral edge of the BGA package substrate. Using the peripheral edge for alignment is a problem with the conventional contactor 300. The vertical dimension of contactor assembly 930 and the length of wire probes 920 must cooperate to place probe tips 922 slightly below the depth of chamfers 984 in alignment plate 980 when no pressure is applied to alignment plate 980.

The device testing procedure utilizing interface apparatus 900 will now be described with reference to FIGS. 10a, 10b, and 10c.

Figure 10A:
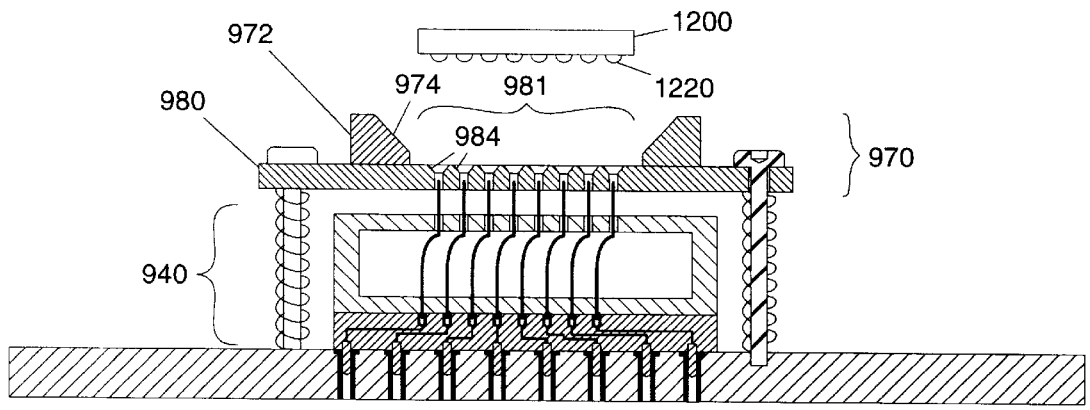
FIGS. 10a–10b are sectional side views of the interface apparatus of the present invention illustrating various operating conditions.
Figure 10B:
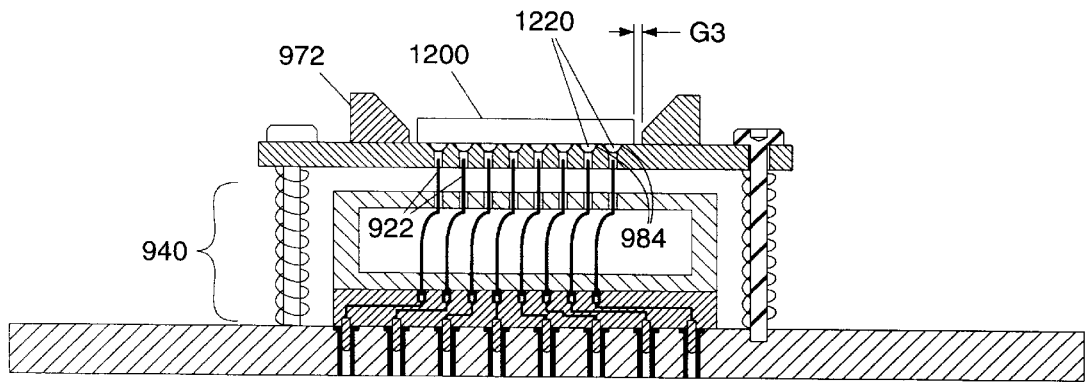

Referring to FIG. 10a, IC 1200 (shown in silhouette) is mounted onto nesting assembly 970 by a device handler (not shown). In particular, the device handler positions IC 1200 over nesting assembly 970, and then releases IC 1200 so that it falls onto alignment plate 980. Each alignment structure 972 includes a relatively long alignment chamfer 974 which facilitates "rough" positioning by causing IC 1200 to slide into central test area 981.

Subsequently, in accordance with another aspect of the present invention, after IC 1200 enters central test area 981 between alignment structures 972, each solder ball 1220 becomes engaged with an associated chamfer 984, thereby providing "fine" alignment of IC 1200 relative to probe tips 922. As shown in FIG. 10b, a small gap G3 is provided between the outer peripheral edge of IC 1200 and the inner surface of alignment structures 972, thereby providing a buffer for misalignments between solder balls 1220 and the peripheral edge of IC 1200.

Figure 10C:
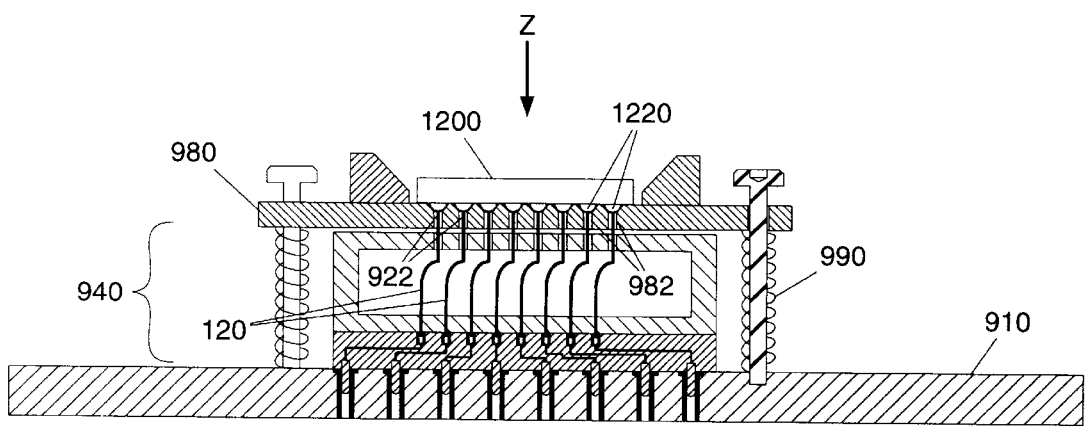

Referring to FIG. 10c, the device handler (not shown) then pushes IC 1200 or alignment plate 980 downward (in the direction indicated by arrow Z) toward probe tips 922 such that each probe tip 922 extends through an associated through-hole 982 and contacts one solder ball 1220 of IC 1200.

In accordance with another aspect of the present invention, each probe tip 922 pierces the outer surface of the associated solder ball 1220. Depending on the diameter of the wire used for wire probes 920, probe tips 922 may be sharp enough to pierce solder balls 1220 without any modifications. If necessary, probe tips 922 can be sharpened to ensure surface penetration. Because probe tip 922 pierces the outer surface of solder ball 1220, probe tip 922 is inserted beyond any oxidation or contaminants on the surface of solder balls 1220, thereby providing reliable electrical contact between wire probes 920 and solder balls 1220. Further, if contaminants adhere to probe tip 922 upon withdrawal from solder ball 1220, the contaminants will be sloughed off probe tip 922 upon piercing a subsequent solder ball 1220. This facilitates reliable device testing by avoiding erroneous test results caused when contaminants build up on the surface of probe tip 922 and reduce the electrical contact between an interface apparatus and an IC under test.

Referring back to FIG. 10c, once probe tips 922 have pierced solder balls 1220, further downward movement of alignment plate 980 causes compression of wire probes 920. Downward movement of alignment plate 980 is limited by the upper surface of vertical probe card 940 and/or resilient members 990. Wire probes 920 are formed such that probe tips 922 provide a substantially uniform pressure to solder balls 1220 over the range of motion of alignment plate 980, which ensures reliable electrical contact while preventing damage to IC 1200 or wire probes 920.

When solder balls 1220 of IC 1200 are connected to wire probes 920 as shown in FIG. 10c, electrical test signals are then transmitted between PCB 910 and IC 1200 through vertical probe card 940. Upon completion of the test signal transmission the device handler then removes IC 1200, and alignment plate 980 is biased into the original position (shown in FIG. 10a) by coil springs 990.

The above description of an embodiment of the present invention is intended to be illustrative and not limiting. For example, in one possible alternative embodiment, coil springs 990 are replaced by leaf springs, elastomers, or other resilient members mounted between the lower surface of alignment plate 980 and the upper surface of PCB 910. In another embodiment, alignment structures 972 can be eliminated when a precision handler can place devices under test accurately enough that only the fine alignment of chamfered holes 982 is needed to properly locate the solder balls for testing of the IC.

Figure 11A:
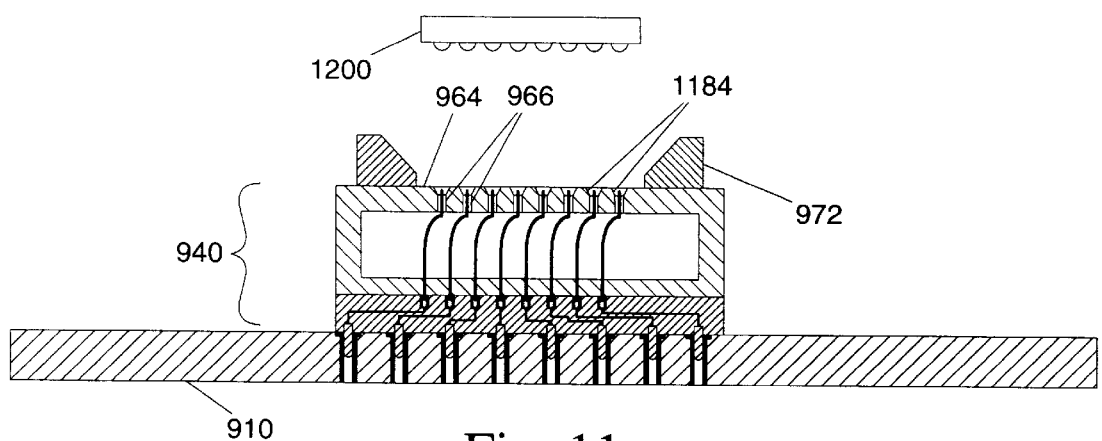
FIGS. 11a and 11b are sectional side views of alternative embodiments of the interface apparatus of the present invention.
Figure 11B:
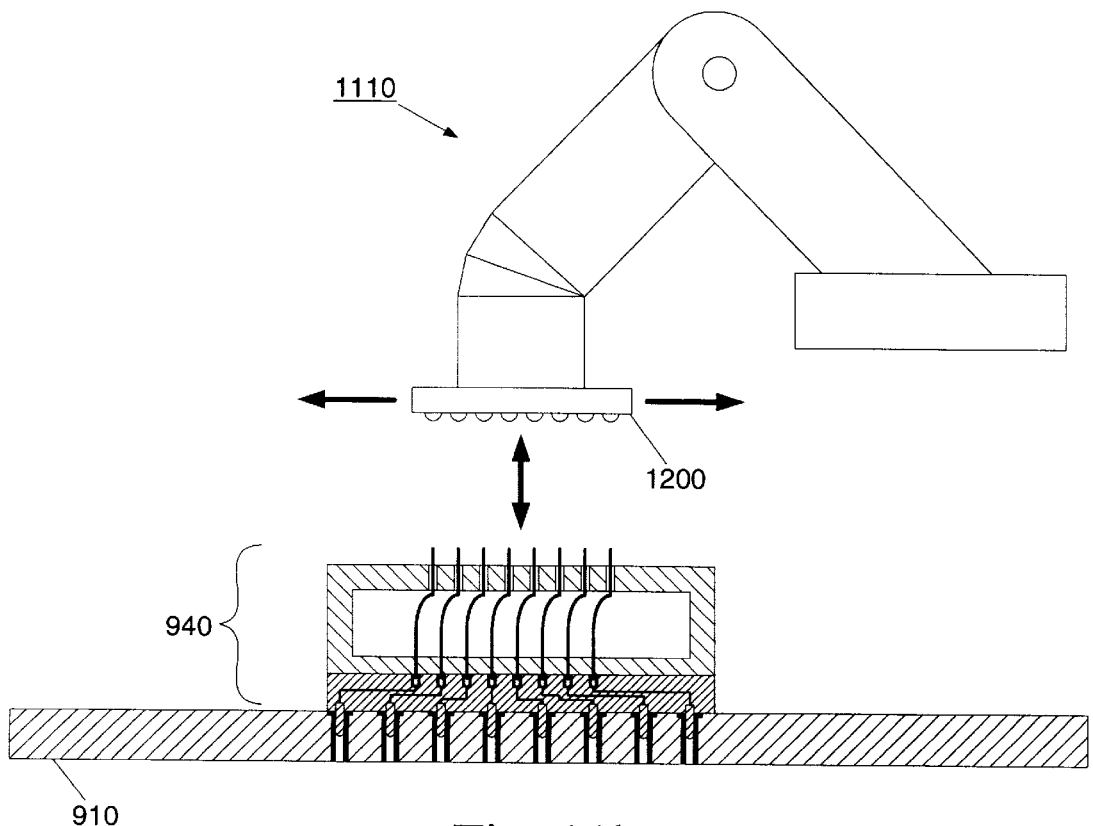
Figure 12A:
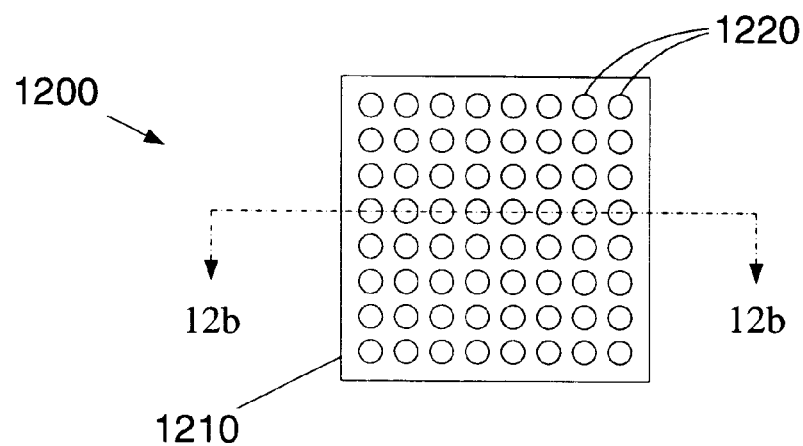
FIGS. 12a and 12b are respective bottom and side sectional views of a simplified "chip scale" ball grid array IC.
Figure 12B:
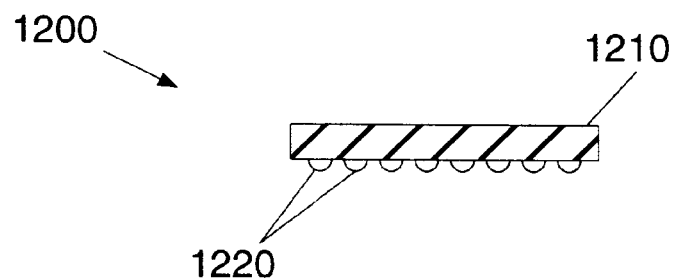

In another embodiment of the present invention illustrated in FIG. 11a, nesting assembly 970 (FIG. 9b) is removed from the interface structure. By mounting alignment structures 972 on the top surface of vertical probe card 940 and adding fine alignment chamfers 1184 to clearance holes 966 in positioning plate 964, IC's can be guided into proper alignment directly on vertical probe card 940. Alternatively, as shown in FIG. 11b, a high precision handler 1110 having enough placement accuracy to place the solder balls of the IC being tested directly on probe tips 922 without any alignment guidance could be used with an unmodified vertical probe card 940. Other embodiments and modifications of the present invention will be obvious to those skilled in the art in view of the above disclosure.

We claim:

1. An apparatus for interfacing between a device tester and an integrated circuit (IC) including a plurality of contact terminals, the apparatus comprising:

a vertical probe card having a plurality of wire probes extending from a top surface of the vertical probe card; and a nesting assembly for receiving the IC, the nesting assembly positioned over the plurality of wire probes;

wherein the nesting assembly further comprises an alignment plate having a lower surface facing the vertical probe card and an upper surface facing away from the vertical probe card, the alignment plate defining a plurality of through holes, each of the plurality of through holes receiving one of the wire probes and including a chamfer formed in the upper surface of the alignment plate to provide fine alignment of the IC within the nesting assembly.

2. The apparatus of claim 1, further comprising a printed circuit board (PCB) having an upper surface and a plurality of guide shafts extending from the upper surface, wherein the alignment plate further defines a plurality of guide holes, and the nesting assembly further comprises:

a resilient member disposed between the upper surface of the PCB and the lower surface of the alignment plate, the resilient member biasing the alignment plate away from the upper surface of the PCB, wherein each of the plurality of guide shafts extends through one of the plurality of guide holes formed in the alignment plate and aligns each of the plurality of through holes with one of the plurality of wire probes.

3. The apparatus of claim 1, wherein the alignment plate further comprises an alignment structure formed around the plurality of through holes, the alignment structure including an alignment chamfer sloping towards the alignment plate such that the IC slides from the alignment chamfer onto the upper surface of the alignment plate over the plurality of through-holes.

4. An apparatus for interfacing between a device tester and a ball grid array integrated circuit (BGA IC) including a plurality of contact terminals, the apparatus comprising:

a circuit board including a plurality of contacts for receiving signals from the device tester, a plurality of sockets, and a plurality of conductive lines connecting selected contacts with selected sockets;

a vertical probe card including a plurality of wire probes and a plurality of mounting pins, each of the plurality of mounting pins being inserted into a selected one of the plurality of sockets to electrically connect a selected one of the plurality of wire probes with the selected one of the plurality of sockets, and each of the plurality of wire probes including a straight probe tip and a formed spring section, the formed spring section biasing the straight probe tip away from the circuit board; and an alignment structure having an upper surface away from the vertical probe card and a lower surface toward the vertical probe card, the alignment structure being formed around the plurality of probe tips defining a central test area, the alignment structure including an alignment chamfer sloping towards the probe tips such that the BGA IC slides from the alignment chamfer into the central test area, the central test area further defining a plurality of through holes, each of the plurality of through holes including a through hole chamfer formed on the upper surface.

5. The apparatus of claim 4 wherein the vertical probe card further comprises a probe assembly including:

a mounting plate having a top surface and a bottom surface; and a positioning plate rigidly positioned above the top surface of the mounting plate and defining a plurality of clearance holes, wherein each of the plurality of wire probes further includes a straight pin terminal fixedly mounted in the mounting plate.

6. The apparatus of claim 5 wherein the vertical probe card further comprises a space transformer having a top surface and a bottom surface, the plurality of mounting pins extending from the bottom surface of the space transformer, and the top surface of the space transformer including a plurality of wire probe sockets, each of the plurality of wire probe sockets being electrically connected to a selected one of the plurality of mounting pins, wherein the pin terminal of each of the plurality of wire probes extends from the bottom surface of the mounting plate and is received in one of the plurality of wire probe sockets, and wherein each of the plurality of probe tips extends into one of the plurality of clearance holes in the positioning plate.

7. The apparatus of claim 6 wherein the plurality of probe tips extend from a top surface of the positioning plate, the apparatus further including a plurality of guide shafts for movably mounting the alignment structure with respect to the vertical probe card and aligning the plurality of through holes of the alignment structure with the plurality of probe tips.

8. The apparatus of claim 4, wherein the alignment structure is movable between a first position in which the plurality of probe tips are located below the through hole chamfers in the central test area, and a second position in which the plurality of probe tips extend into the through hole chamfers.

9. The apparatus of claim 7, wherein the nesting assembly further comprises a resilient member, the resilient member biasing the alignment plate away from the vertical probe card.

* * * * *